United States Patent [19]

Lichtenberg

[11] 4,188,417
[45] Feb. 12, 1980

[54] METHOD OF APPLYING A DIELECTRIC LAYER TO A SUBSTRATE AND A MASK-FORMING COATING FOR THE APPLICATION OF A DIELECTRIC LAYER

[75] Inventor: Wolfgang Lichtenberg, Balzers, Liechtenstein

[73] Assignee: Balzers Patent-und Beteiligungs-Aktiegesellschaft, Liechtenstein

[21] Appl. No.: 916,560

[22] Filed: Jun. 19, 1978

Related U.S. Application Data

[63] Continuation of Ser. No. 793,510, May 4, 1977, abandoned.

[51] Int. Cl.² .............................................. B05D 3/02
[52] U.S. Cl. .................................. 427/229; 427/162; 427/166; 427/248 R; 427/255; 427/259; 427/264; 427/269; 427/282; 427/287; 427/376 G
[58] Field of Search ................... 427/282, 229, 248 R, 427/192, 191, 376 G, 259, 162, 166, 255, 287, 269, 264

[56] References Cited

U.S. PATENT DOCUMENTS

| | | | |
|---|---|---|---|
| 2,995,461 | 8/1961 | Biocey et al. | 427/259 |
| 3,645,497 | 3/1972 | Levine et al. | 427/259 |
| 3,754,987 | 8/1973 | Purdes | 427/282 |
| 3,779,807 | 12/1973 | Taylor et al. | 427/229 |
| 3,925,080 | 12/1975 | Postma | 427/229 |
| 3,932,681 | 1/1976 | Forker | 427/282 |
| 3,982,941 | 9/1976 | Inskip | 427/226 |
| 4,011,143 | 3/1977 | Del Monte et al. | 427/282 |
| 4,022,641 | 5/1977 | Lindberg | 427/259 |
| 4,027,052 | 5/1977 | Thompson | 427/229 |
| 4,053,350 | 10/1977 | Olsen et al. | 427/259 |
| 4,073,981 | 2/1978 | Baron | 427/259 |
| 4,088,799 | 5/1978 | Kurtin | 425/259 |

*Primary Examiner*—Ronald H. Smith
*Assistant Examiner*—Janyce A. Bell
*Attorney, Agent, or Firm*—McGlew and Tuttle

[57] ABSTRACT

A method of applying a dielectric layer to a substrate, comprises applying a metallic suspension, for example, a layer of so-called "conducting silver" which is a suspension of silver particles in an organic binder or solvent to the substrate surface in an area which is not to receive the dielectric layer so as to form a mask. The organic binder or solvent is advantageously decomposed by heating so as to leave the metallic deposit mask. Thereafter, a layer of dielectric material is applied over the substrate in the areas which are not covered by the mask and, subsequently, the mask is removed, such as by dissolving it. A mask-forming coating for the application of the dielectric layers on the substrate comprises a metallic suspension which may be in the form of a lacquer-type liquid or paste which contain noble metals, for example, in the form of tinsels as the conducting constituent and also include organic binders or solvents of various kinds.

8 Claims, 2 Drawing Figures

METHOD OF APPLYING A DIELECTRIC LAYER TO A SUBSTRATE AND A MASK-FORMING COATING FOR THE APPLICATION OF A DIELECTRIC LAYER

This is a continuation, of application Ser. No. 793,510 filed May 4, 1977, now abandoned.

FIELD AND BACKGROUND OF THE INVENTION

This invention relates in general to a method and apparatus for forming coatings on substrates and, in particular, to a mask-forming coating for the application of a dielectric layer and to a method of applying the dielectric layer to the substrate.

DESCRIPTION OF THE PRIOR ART

The present invention relates to the application of thin dielectric layers, for example, of oxides, nitrides, etc. on substrates, in a distribution corresponding to a pattern. Such a deposition is required, for example, to produce so-called phase rings for phase microscopes, in which a ring of an oxide coating having a predetermined thickness is to be applied on a transparent supporting plate. In other applications, for example, a filter coating comprising a plurality of oxide layers deposited by evaporation must cover only a part of a supporting plate, while another area is to be kept free, as in a case where a window is to be provided in a coating, or the like.

Still another application would be in producing ornamental inscriptions or patterns. Frequently, in the evaporation technique, the problem arises as to how to protect certain surface areas of complicated bodies from vapor deposition, for example, during vaporation of prisms for optical instruments. Up to the present time, patterned coatings have bee produced frequently so that a so-called mask or template is placed in front of the surface of a substrate to be coated and then the vacuum evaporation or cathode sputtering is carried out through this mask. The molecules of the substance to be deposited can reach the substrate only through the apertures of the mask and form the deposit in the respective desired areas.

It is well known to provide a mask directly on the surface of the substrate, leaving free surface areas where the vapor deposition is desired and covering the remaining areas. To this end, special lacquers have been developed and a layer of such a lacquer is applied as a masking layer to those surface areas which are to be protected from vapor deposition. So-called photosensitive resists are also available which cure upon being exposed to light. In the photo-resist technique, the entire surface of the substrate is first coated with a layer of photosensitive resist which, thereupon, is exposed to light in accordance with the desired pattern, and is developed. Finally, those areas of the photoresist layer which have not been exposed to light and thus have not been cured are removed by means of suitable solvents so that a resist layer conforming to the pattern remains as a mask on the substrate. However, using lacquer or resist layers as masks have the disadvantage that if the vapor deposition is carried out at an elevated temperature of the substrate, they may adhere so strongly that they can hardly be removed.

SUMMARY OF THE INVENTION

The present invention is directed to a novel method of depositing dielectric layers on substrates in a distribution true to a pattern, in which metallic vaporization masks are used in a simple way. The method makes it possible to avoid complicated supports and masking structures. The provided method is of particular importance to vaporizing processes in which the substrates must be heated in advance or during the vapor deposition, since in such cases, the known photoresist technique fails to work.

In accordance with the invention, for the application of dielectric layers to substrates by vapor deposition or cathode sputtering, a metal layer produced from a metallic suspension in an organic medium is provided as a stop-off, mask-forming, coating. The metal layer is produced in a manner known per se by drying the suspension which has been applied in advance to the substrate in a true-to-pattern distribution at room temperature or even at an elevated temperature.

As compared to the hitherto frequently used special lacquers for masks, the metallic masks to be used in accordance with the invention have the advantage that they result in a substantially simplified operation. They also make it possible to deposit the dielectric layers at elevated temperatures of the substrate, which is important for many vapor deposition processes. In contrast thereto, mask-forming layers of lacquer tend to cure at elevated temperatures and their subsequent removal is very difficult, if not impossible.

Accordingly, it is an object of the invention to provide a method of applying a dielectric layer to a substrate which comprises applying a metallic suspension to the surface of the substrate in an area which is not to receive the dielectric layer to form a mask, and applying the dielectric layer to the substrate in the area not covered by the mask and subsequently removing the mask.

A further object of the invention is to provide a mask for masking areas of the substrate for the application of a dielectric layer onto the substrate which comprises a metallic suspension.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there are illustrated preferred embodiments of the invention.

DESCRIPTION OF THE PREFERRED EMBODIMENTS

Figure 1:
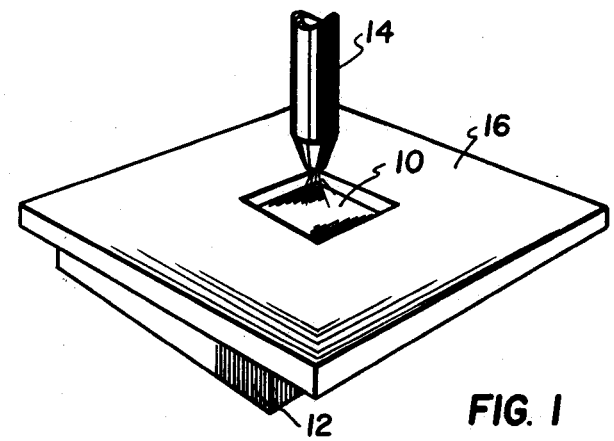
FIG. 1 is a top perspective view of a substrate being coated with a mask in accordance with the invention.
Figure 2:
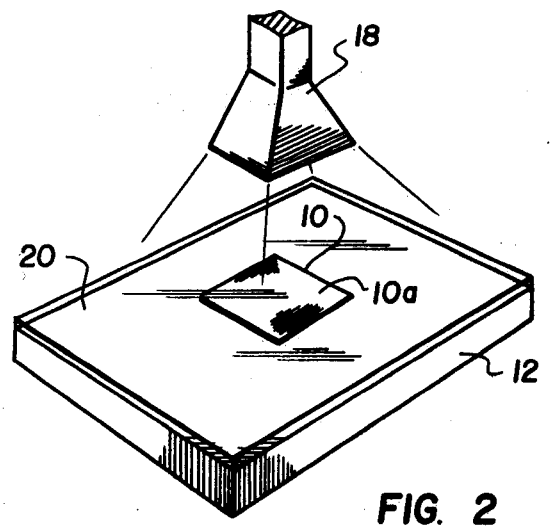
FIG. 2 is a top perspective view indicating the heating and dissolving of the binders of the mask and the areas in which the dielectric layer is applied to the substrate in accordance with the invention.

Referring to the drawing in particular, in order to produce, for example, an oxide layer distributed on a substrate in accordance with a desired pattern prior to depositing the oxide layer by evaporation, a metallic mask 10 corresponding to the negative of the pattern is applied to the surface of the substrate and after the vapor depositing operation, the mask, along with the portions of the oxide layer deposited thereon, is removed from the substrate.

The method comprises the following consecutive steps:

In a distribution corresponding to the desired mask, the surface of the substrate 12 is coated, for example, with a layer of so-called "conducting silver" which is a suspension of silver particles in an organic binder or solvent, and which decomposes upon heating and forms a metallic deposit forming the mask 10. The suspension may be applied in a very simple manner with a brush, which has not been shown. However, the known screen printing methods may also be applied, as well as spray methods in which the fluid metal preparation is sprayed by a spray device 14 onto the surface through templates 16 of suitable geometry. Thus, for a series application of masks to substrates to be coated, no more than a single spray template must be manufactured. Metal preparations suitable for the inventive purpose are commercially available in the form of lacquer-type liquids and pastes. In most cases, they contain noble metals in the form of tinsels as the conducting constituent and organic binders or solvents of various kinds.

The substrate is brought to an elevated temperature by a heating device 18 so that the desired metal layer 10a is deposited, and the binder is volatilized or decomposed. The metal deposit, conforming to the pattern, serves as a vaporization mask for the subsequent operational steps.

The dielectric layer 20 is then applied by evaporation or cathode sputtering to the substrate. Since the mask covers the areas of the substrate which are not to be coated, a deposit directly on the substrate is produced only in the areas corresponding to the desired pattern. Further, since the mask-forming metal layer is deposited on the substrate surface directly, without any gap, the inventive method avoids the marginal unsharpness of the vapor deposit which inevitably occurs if self-supporting maks placed in front of the substrate are used.

It is also possible to use such a mask for providing a dielectric coating of a plurality of superimposed individual layers. This coating may comprise a multiple-layer system of alternately high and low refractive oxide layers, for example, so that due to the interference phenomena, a color reflection of the pattern is obtained.

Finally, the mask-forming coating, along with the portions of the dielectric layers deposited therein, is removed by means of a solvent. For this purpose, any reagent can be sued which attacks the metal of which the mask is constituted, but which does not attack the dielectric coating itself. For masks produced from silver or copper preparations, in most cases, for example, nitric acid may be used as the solvent. That is, nitric acid does not attack the dielectric substances usually employed in the vaporization technique, such as, SiO, $SiO_2$, $Si_2O_3$, $TiO_2$, $Al_2O_3$, $ZrO_2$, $MgF_2$, etc.

With the method of the invention, a metallic and non-metallic suspension is subjected to treatment which is referred to herein as decomposing treatment so as to form a metallic suspension of substantially pure metal which is applied as a mask to a portion of the surface of the substrate in an area which is not to receive the dielectric layer so as to leave a remaining uncovered layer. Thereafter, the dielectric layer is applied to the substrate to cover the uncovered remaining area by a vapor deposition. In the connection in which it is used, decomposition merely means that the majority of the non-metallic component of the suspension is removed so that substantially the pure metal remains on the substrate as a coating. Whether this decomposition represents only an evaporation of the organic carrier or whether a chemical decomposition takes place depends on the type of organic carrier.

The inventive method has proved very inexpensive for processes using simple masks, for example, for making filter plates having margins free from coating. In such cases, the fluid metal preparation may be applied easily with a fine hair brush and no special, expensive, devices are needed as is frequently the case in the production of masks. The heating and drying may take place in any usual laboratory furnace. The metal layers thus obtained are opaque; about 4 microns thick, and are free from pores or holes. It is advantageous to provide a thickness which is greater than the thickness of the dielectric layers to be vaporized or sputtered, since during removal in this case, the edges of the mask-forming metal coating can be attacked by the solvent laterally, which substantially accelerates the spearation thereof.

While specific embodiments of the invention have been shown and described in detail to illustrate the application of the principles of the invention, it will be understood that the invention may be embodied otherwise without departing from such principles.

What is claimed is:

1. A method of applying a dielectric layer to a substrate which can be heated to a temperature above ambient, comprising applying a mask of a suspension of metal in an organic binder to a substrate in areas not to receive the dielectric layer, heating the suspension to decompose the binder and to leave a metal deposit on a portion of the surface of the substrate in an area which is not to receive the dielectric layer and leaving an uncovered remaining area, applying the dielectric layer to the substrate on the uncovered remaining area at the elevated temperature by vapor deposition, and thereafter removing the mask by applying a solvent to dissolve the metal deposit of the mask.

2. A method according to claim 1, wherein the mask is removed by dissolving it with a nitric acid.

3. A method according to claim 1 wherein the mask comprises the organic binder and at least one layer of a metal chosen from: silver and copper, and wherein the mask is removed by dissolving it with nitric acid.

4. A method according to claim 1 wherein the metal suspension is applied by brushing it onto the substrate.

5. A method according to claim 1, wherein said metallic suspension comprises a suspension of silver particles in an organic binder.

6. A method according to claim 1, wherein said mask comprises a silver metallic suspension.

7. A method according to claim 1, wherein the dielectric layer is applied wet, and including heating and subsequently drying the dielectric layer and then applying a solvent onto the substrate to remove the mask.

8. A method of applying a dielectric layer to a substrate which can be heated to a temperature above ambient, comprising applying a mask of a suspension of metal in an organic liquid to a portion of the surface of the substrate in an area which is not to receive the dielectric layer and leaving an uncovered remaining area, heating the suspension of metal in an organic liquid so as to form a metallic pattern of substantially pure metal, applying the dielectric layer to the substrate on the uncovered remaining area at the elevated temperature by vapor deposition, and thereafter removing the mask by applying a solvent to dissolve the metallic suspension of the mask.

* * * * *